United States Patent
Lee et al.

(10) Patent No.: US 7,645,640 B2
(45) Date of Patent: Jan. 12, 2010

(54) INTEGRATED CIRCUIT PACKAGE SYSTEM WITH LEADFRAME SUBSTRATE

(75) Inventors: Cheonhee Lee, Cheong-ju (KR); Youngnam Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 231 days.

(21) Appl. No.: 11/163,561

(22) Filed: Oct. 23, 2005

(65) Prior Publication Data

US 2006/0102989 A1    May 18, 2006

Related U.S. Application Data (60) Provisional application No. 60/628,515, filed on Nov. 15, 2004.

(51) Int. Cl.
    *H01L 21/00*    (2006.01)
(52) U.S. Cl. .................. 438/124; 438/106; 438/111; 438/123; 257/E23.052; 257/676; 257/687
(58) Field of Classification Search .......... 257/E21.514, 257/E23.092, 676, 687, 673, 678, 690, 778, 257/E23.039, E23.046; 438/112, 123, 106, 438/111, 108, 121, 124, 127
    See application file for complete search history.

(56) References Cited

U.S. PATENT DOCUMENTS

| | | | | |
|---|---|---|---|---|
| 5,302,849 A * | 4/1994 | Cavasin | ...................... | 257/666 |
| 5,444,301 A * | 8/1995 | Song et al. | .................. | 257/737 |
| 5,567,656 A * | 10/1996 | Chun | ......................... | 438/112 |
| 5,866,939 A * | 2/1999 | Shin et al. | .................... | 257/666 |
| 6,208,021 B1 * | 3/2001 | Ohuchi et al. | ............... | 257/690 |
| 6,303,997 B1 * | 10/2001 | Lee | ............................. | 257/778 |
| 6,400,004 B1 | 6/2002 | Fan et al. | ..................... | 257/666 |
| 6,507,120 B2 * | 1/2003 | Lo et al. | ..................... | 257/778 |
| 6,531,769 B2 * | 3/2003 | Yamaguchi | ................. | 257/692 |
| 6,566,168 B2 * | 5/2003 | Gang | ......................... | 438/112 |
| 6,597,059 B1 * | 7/2003 | McCann et al. | ............. | 257/673 |
| 6,696,747 B1 | 2/2004 | Lee et al. | ..................... | 257/666 |
| 6,759,737 B2 * | 7/2004 | Seo et al. | ..................... | 257/686 |
| 6,873,032 B1 * | 3/2005 | McCann et al. | ............. | 257/673 |
| 7,045,882 B2 * | 5/2006 | Paek | .......................... | 257/666 |
| 2002/0020907 A1* | 2/2002 | Seo et al. | ..................... | 257/687 |
| 2002/0114588 A1* | 8/2002 | Golwalkar et al. | ............ | 385/88 |
| 2005/0173793 A1 | 8/2005 | Rohrmoser et al. | ......... | 257/724 |

* cited by examiner

*Primary Examiner*—Chris C Chu
(74) *Attorney, Agent, or Firm*—Mikio Ishimaru (57) ABSTRACT

A system for manufacturing an integrated circuit package system is provided. A dual-type leadframe having first and second rows of leads is formed. A first row of bumps is formed on an integrated circuit chip. Solder paste is placed on the first row of leads, and the first row of bumps is pressed into the solder paste on the first row of leads. The solder paste is reflow soldered to form solder and connect the integrated circuit chip to the first row of leads, and the integrated circuit chip, the first row of bumps, the solder, and the leadframe are encapsulated.

14 Claims, 6 Drawing Sheets

FIG. 15

INTEGRATED CIRCUIT PACKAGE SYSTEM WITH LEADFRAME SUBSTRATE

CROSS-REFERENCE TO RELATED APPLICATION(S)

This application claims the benefit of U.S. Provisional Patent Application Ser. No. 60/628,515 filed Nov. 15, 2004, and the subject matter thereof is hereby incorporated herein by reference thereto.

TECHNICAL FIELD

The present invention relates generally to integrated circuit package systems, and more particularly to integrated circuit package system with leadframes.

BACKGROUND

Integrated circuit dies are used in electronic products, such as cell phones, disc players, and computers, are encapsulated in a mold material to provide protection from hostile environments and enable electrical interconnection between the integrated circuit die and an underlying substrate such as a printed circuit board (PCB). The leadframe is the central supporting structure of such a package being completely contained within the encapsulant except for the leads.

For purposes of high-volume, low-cost production of chip packages, a current industry practice is to etch or stamp a thin sheet of metal material to form a panel or strip that defines multiple leadframes. A single strip may be formed to include multiple arrays, with each such array including a multiplicity of leadframes in a particular pattern. In an integrated circuit package manufacturing process, the integrated circuit dies are mounted and wire and/or ball bonded to respective leadframes, with the encapsulant material then being applied to the strips to encapsulate the integrated circuit dies, bond connections, and portions of each of the leadframes.

After hardening of the encapsulant material, the leadframes within the strip are cut apart or singulated for purposes of producing the individual integrated circuit packages. Such singulation is typically accomplished via a saw singulation process. In this process, a saw blade is advanced along "saw streets" which extend in prescribed patterns between the leadframes as required to facilitate the separation of the leadframes from each other in the required manner.

In leadframe design, the leadframe does not define a continuous, uninterrupted surface. Rather, individual leads of the leadframe are separated from each other and from the peripheral edge of a die pad (if included in the leadframe) by narrow gaps. The die pad of the leadframe, if included therein, is the supporting structure to which the die is typically attached.

Currently, leadframe packages are limited with regard to input/output (I/O) count by the difficulties of leadframe manufacturing. At this point, fine-pitch leadframes are limited to 100 μm spacing when manufactured using current etching techniques.

Solutions to these problems have been long sought but prior developments have not taught or suggested any solutions and, thus, solutions to these problems have long eluded those skilled in the art.

DISCLOSURE OF THE INVENTION

The present invention provides a system for manufacturing an integrated circuit package system. A dual-type leadframe having first and second rows of leads is formed. A first row of bumps is formed on an integrated circuit chip. Solder paste is placed on the first row of leads, and the first row of bumps is pressed into the first row of solder paste. The solder paste is reflow soldered to form solder and connect the integrated circuit chip to the first row of leads, and the integrated circuit chip, the bumps, the solder, and the leadframe are encapsulated.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE DRAWINGS

DETAILED DESCRIPTION OF THE PREFERRED EMBODIMENTS

In the following description, numerous specific details are given to provide a thorough understanding of the invention. However, it will apparent that the invention may be practiced without these specific details. In order to avoid obscuring the present invention, some well-known system configurations and process steps are not disclosed in detail.

The term "horizontal" as used herein is defined as a plane parallel to the conventional plane or surface of the integrated circuit (IC) package leadframe, regardless of its orientation. The term "vertical" refers to a direction perpendicular to the horizontal as just defined. Terms, such as "on", "above", "below", "bottom", "top", "over", and "under", are defined with respect to the horizontal plane. A dual-type leadframe is defined as having at least two rows of lead tips.

Likewise, the drawings showing embodiments of the invention are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

Figure 1:
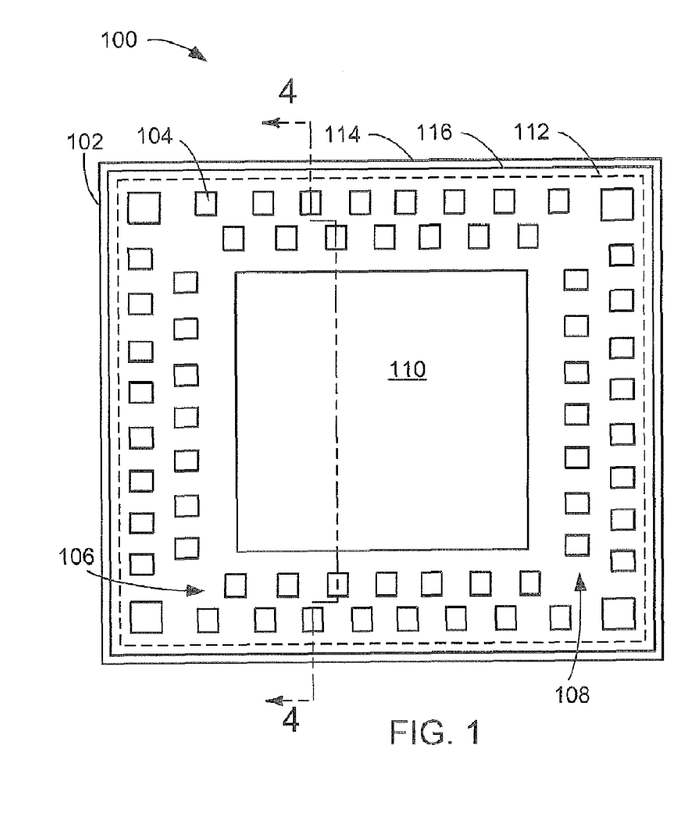
FIG. 1 shows a plan view of a half-etched, dual-type leadframe integrated circuit package system in accordance with an embodiment of the present invention.

Referring now to FIG. 1, therein is shown a plan view of a half-etched, dual-type leadframe integrated circuit package system 100 in accordance with an embodiment of the present invention. The system 100 includes a leadframe 102 having lead tips 104 in first rows 106 and second rows 108. The input/output (I/O) count as determined by the number of lead tips 104 can be more closely packed than previously possible. Surrounded by the lead tips 104 is a paddle 110. The paddle 110 can use either dimple or groove designs depending on considerations such as thermal cooling, warpage reduction, and increasing the ability to mount die.

The molding compound is not shown and a dotted outline of an integrated circuit chip 112 is shown over the leadframe 102.

The system 100 is singulated from other similar systems along a sawing outline 114 and a sawing inline 116. The system 100 has the bottom of the molding encapsulant and the leadframe having the characteristics of being etched to expose the bottoms of the lead tips 104, which form the terminals for the integrated circuit chip 112.

Figure 2:
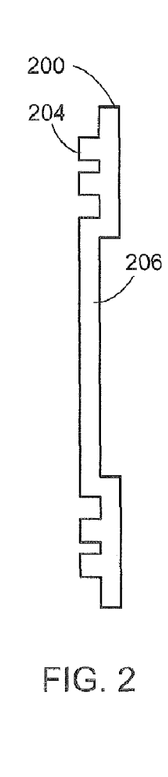
FIG. 2 shows a cross-sectional view of the leadframe of FIG. 1 as initially manufactured.

Referring now to FIG. 2, therein is shown a cross-sectional view of the leadframe 102 of FIG. 1 as initially manufactured. In FIG. 2, a leadframe 200 is a single structure combining lead tips 204 and a paddle 206.

Figure 3:
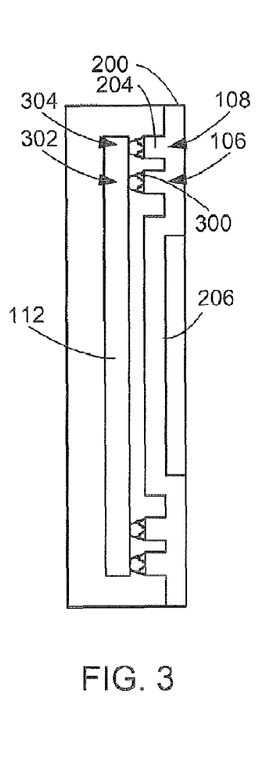
FIG. 3 shows a cross-sectional view of the structure of FIG. 2 after further processing.

Referring now to FIG. 3, therein is shown a cross-sectional view of the structure of FIG. 2 after further processing. The leadframe 200 has had solder paste 300 deposited on the lead tips 204, and the integrated circuit chip 112 having first and second rows of solder bumps 302 and 304 thereon has been placed with the bumps pressed into the solder paste 300 on the respective first and second rows of lead tips 106 and 108.

Figure 4:
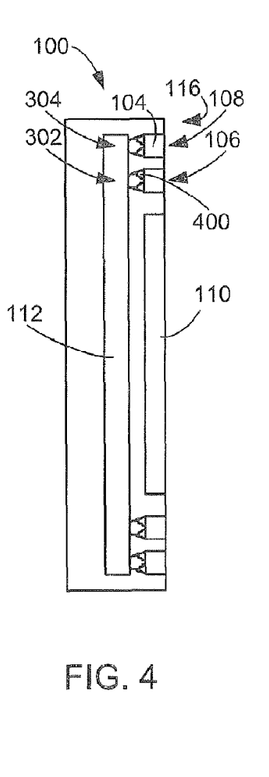
FIG. 4 shows a cross-sectional view of FIG. 1 along line 4-4 of FIG. 1.

Referring now to FIG. 4, therein is shown a cross-sectional view of FIG. 1 along line 4-4 of FIG. 1. The solder paste 300 has been reflowed into solder 400. A process such as etching has been used to planarize the bottom of the FIG. 3 structure so as to separate the lead tips 104 from each other and from the paddle 110. The etching is generally half-way through the lead tips 204. The etching leaves a characteristic etched finish on the lead tips 204. Further processing by sawing along the sawing inline 116 has singulated the system 100.

Figure 5:
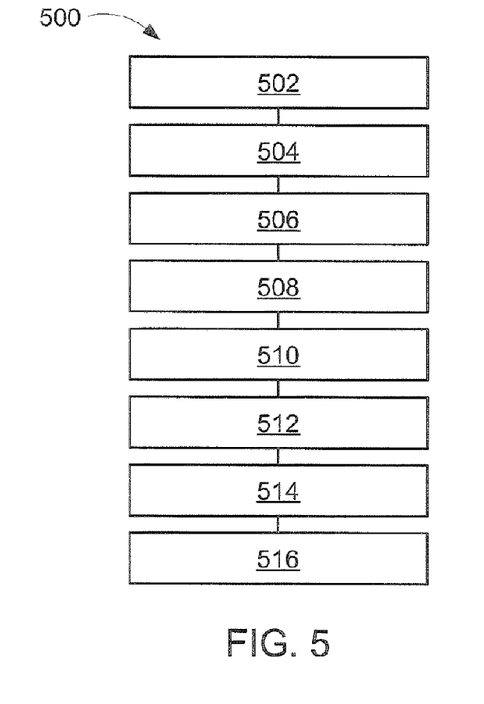
FIG. 5 shows a flow chart for an integrated circuit system for manufacturing the structure of FIG. 4.

Referring now to FIG. 5, therein is shown a flow chart for an integrated circuit system 500 for manufacturing the integrated circuit package system 100 of FIG. 4.

The system 500 includes wafer backgrinding and singulation sawing in a block 502; putting solder bumps on an integrated circuit chip in a block 504; putting solder paste on lead tips of a leadframe in a block 506; attaching the integrated circuit chip to the leadframe in a block 508; molding encapsulant around the integrated circuit chip and the leadframe in a block 510; half-etching the encapsulant and the leadframe to expose terminals in a block 512; finish plating the terminals in a block 514; and singulation into individual packages in a block 516.

Figures 6, 7:
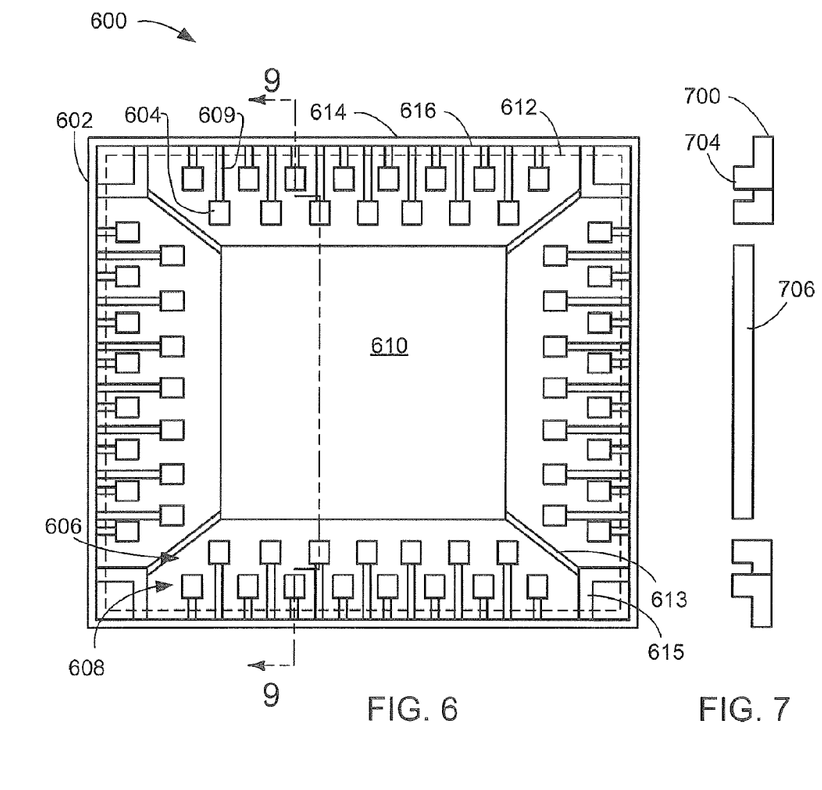
FIG. 6 shows a plan view of a tie bar support, dual-type leadframe integrated circuit package system in accordance with another embodiment of the present invention.
FIG. 7 shows the structure of FIG. 6 as initially manufactured.

Referring now to FIG. 6, therein is shown a plan view of a tie bar support, dual-type leadframe integrated circuit system 600 in accordance with another embodiment of the present invention. The system 600 includes a leadframe 602 having lead tips 604 in first and second rows 606 and 608. The lead tips 604 are supported by lead tip supports 609.

Surrounded by the lead tips 604 is a paddle 610, and shown over the paddle 610 is the outline of an integrated circuit chip 612. The paddle 610 can use both dimple and groove designs. The lead frame 602 has tie bars 613 and tie bar supports 615 supporting the paddle 610 at each corner.

The molding compound is not shown and the dotted outline of the integrated circuit chip 612 is shown over the leadframe 602.

The system 600 is singulated from other similar systems along a sawing outline 614 and a sawing in line 616. This separates the lead tips 604 from each other and also separates the paddle 610.

The input/output count as determined by the number of lead tips 604 can be more closely packed than previously possible.

With reference to FIG. 6, it would be understood that is possible to have a design without the paddle 610, which eliminates the paddle 610, the tie bar 613, and the tie bar support 615.

Referring now to FIG. 7, therein is shown a cross-section view of the leadframe 602 of FIG. 6 as initially manufactured. In FIG. 7, a leadframe 700 is a single structure combining lead tips 704 and paddle 706.

Figure 8:
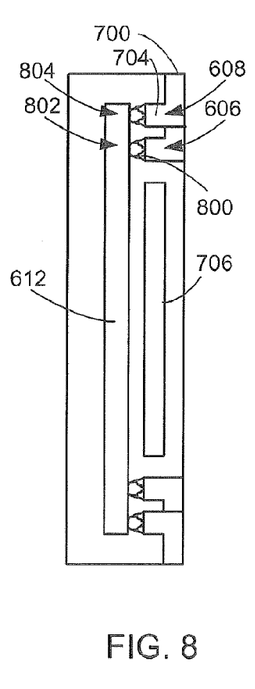
FIG. 8 shows the structure of FIG. 7 after further processing.

Referring now to FIG. 8, therein is shown a cross-sectional view of the structure of FIG 7 after further processing. The leadframe 700 has had solder paste 800 deposited on the lead tips 704, and the integrated circuit chip 612 having solder bumps 802 and 804 thereon has been placed with the solder bumps 802 and 804 pressed into the solder paste 800 on the respective first and second rows of lead tips 606 and 608.

Figure 9:
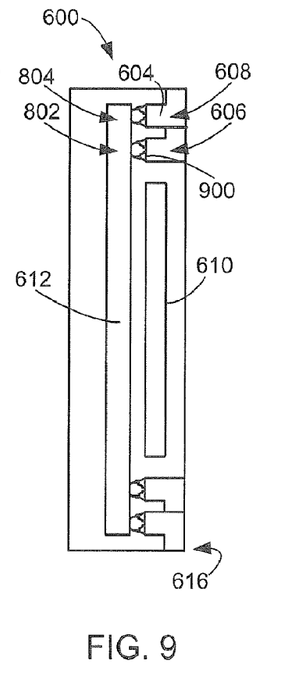
FIG. 9 shows a cross-sectional view of the structure of FIG. 6 taken along line 9-9 after further processing.

Referring now to FIG. 9, therein is shown a cross-sectional view of FIG. 6 along line 9-9 of FIG. 6. The solder paste 800 has been reflow soldered into solder 900. Further processing by sawing along the sawing inline 616 has singulated the system 600 so as to separate the lead tips 604 from each other and the paddle 610.

Figure 10:
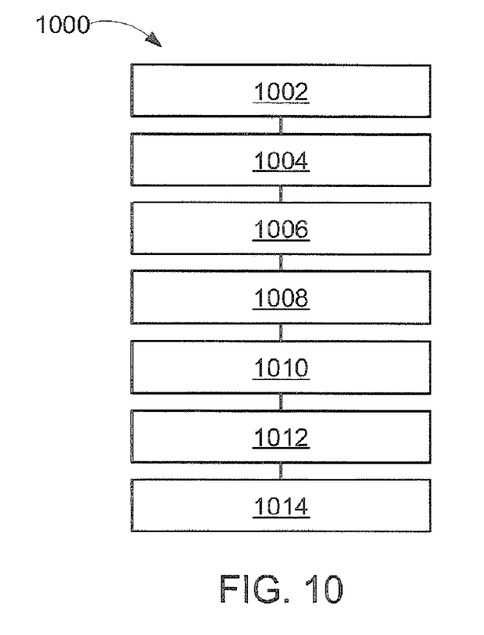
FIG. 10 shows the integrated circuit package system used in manufacturing the structure of FIG. 6.

Referring now to FIG. 10, therein is shown an integrated circuit system 1000 for manufacturing the integrated circuit package system 600 of FIG. 6.

The system 1000 includes B/G and sawing in a block 1002; putting solder bumps on an integrated circuit chip in a block 1004; putting solder paste on lead tips of a leadframe in a block 1006; attaching the integrated circuit chip to the leadframe in a block 1008; molding encapsulant around the integrated circuit chip and leadframe in a block 1010; finish plating terminals in a block 1012; and singulation into individual packages in a block 1014.

Figure 11:
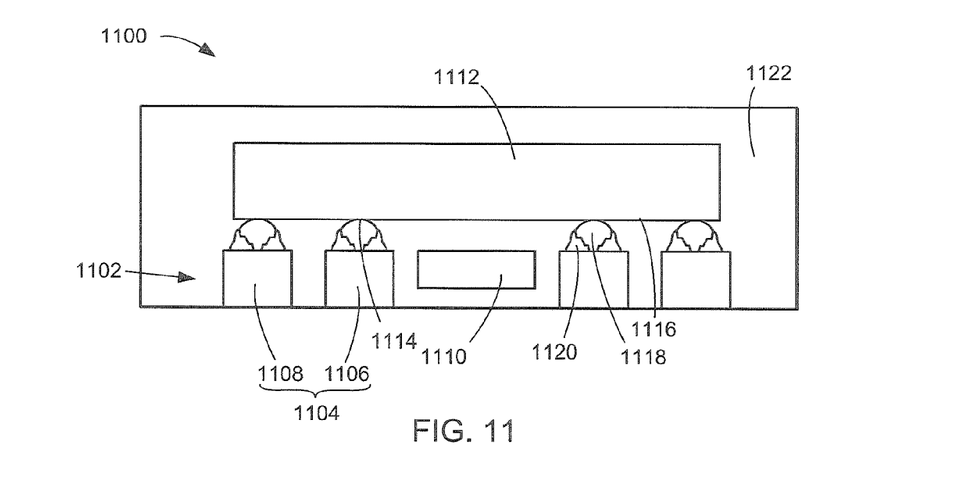
FIG. 11 shows a cross-sectional view of a flip chip quad flat no lead (QFN) package system with a dual-type leadframe in accordance with still another embodiment of the present invention.

Referring now to FIG. 11, therein is shown a cross-sectional view of a flip chip quad flat no lead (QFN) package system 1100 with a dual-type leadframe in accordance with still another embodiment of the present invention. The system 1100 includes a leadframe 1102 having lead tips 1104 in first rows 1106 and second rows 1108. The input/output (I/O) count as determined by the number of lead tips 1104 can be more closely packed than previously possible. Surrounded by the lead tips 1104 is a paddle 1110. The paddle 1110 can use both dimple and groove designs.

Over the paddle 1110 is an integrated circuit chip 1112 having bonding pads 1114 on an active surface 1116. The bonding pads 1114 are bonded to bumps 1118 which are pressed into solder paste 1120 on the respective first and second rows of lead tips 1106 and 1108, and reflowed to make the lead-tip-to-chip bonds. The integrated circuit chip 1112 is encapsulated in a molding compound 1122.

Figure 12:
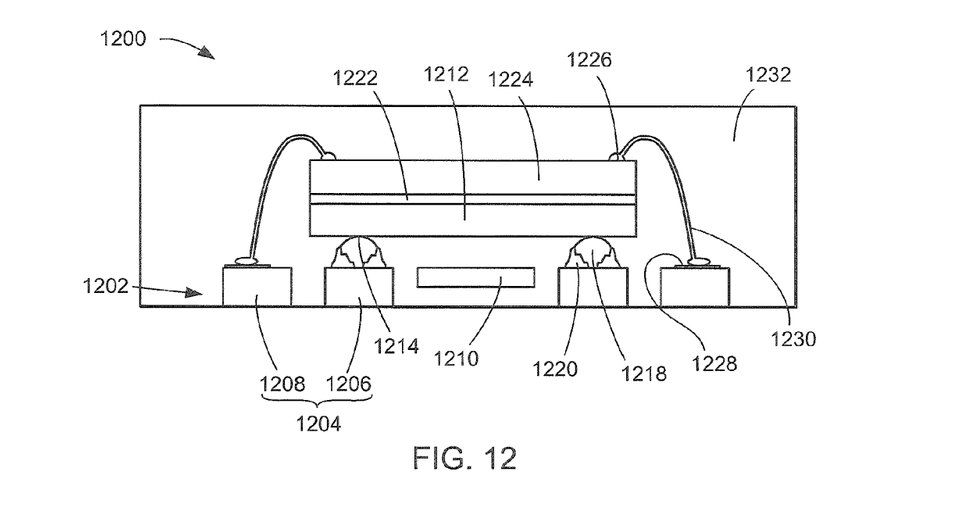
FIG. 12 shows a stacked two-die package system with a dual-type leadframe in accordance with another embodiment of the present invention.

Referring now to FIG. 12, therein is shown a stacked two-die package system 1200 with a dual-type leadframe 1202 in accordance with a further embodiment of the present invention. The system 1200 includes the leadframe 1202 having lead tips 1204 in first rows 1206 and second rows 1208. The input/output (I/O) count as determined by the number of lead tips 1204 can be more closely packed than previously possible. Surrounded by the lead tips 1204 is a paddle 1210. The paddle 1210 can use both dimple and groove designs.

Over the paddle 1210 is a first integrated circuit chip 1212 having bonding pads 1214 on an active surface 1116. The bonding pads 1214 are bonded to bumps 1218 which are pressed into solder paste 1220 on the first lead tips 1206 and reflowed to make the lead-tip-to-chip bonds.

Attached over the first integrated circuit chip 1212 by an adhesive 1222 is a second integrated circuit chip 1224. The second integrated circuit chip 1224 has pads 1226 and is wire bonded to plating layers 1228 on the second lead tips 1208 by bond wires 1230.

The first and second integrated circuit chips 1212 and 1224 are encapsulated in a molding compound 1232.

Figure 13:
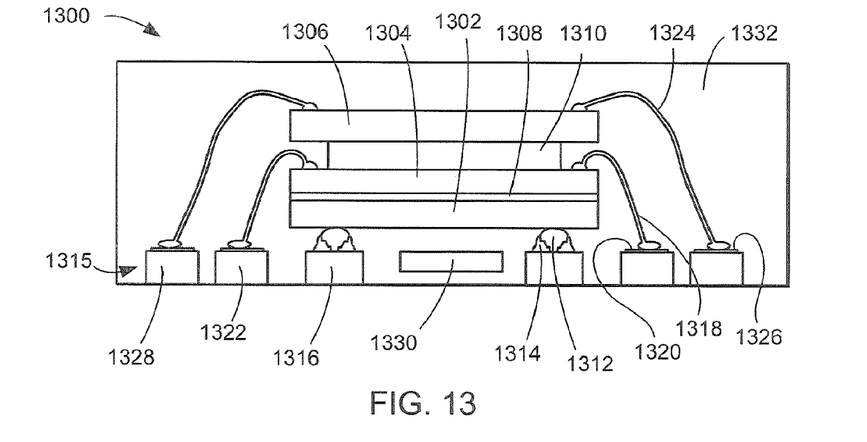
FIG. 13 shows a stacked three-die package system with a dual-type leadframe in accordance with a still further embodiment of the present invention.

Referring now to FIG. 13, therein is shown a stacked three-die package system 1300 with a dual-type leadframe 1302 in accordance with a still further embodiment of the present invention. The package 1300 has a first integrated circuit chip 1302, a second integrated circuit chip 1304, and a third integrated circuit chip 1306. The first and second integrated circuit chips 1302 and 1304 are bonded together with die attach material 1308, such as epoxy or tape. The second integrated circuit chip 1304 is bonded to a Si spacer 1310, and the third integrated circuit chip 1306 is bonded to the Si spacer 1310.

The first integrated circuit chip 1302 has solder bumps 1312 pressed into solder paste 1314 on a first row of leads 1316 of a leadframe 1315.

The second integrated circuit chip 1304 has first bonding wires 1318 bonded to a plating layer 1320 on a second row of leads 1322. The Si spacer 1310 is thick enough to allow clearance for the first bonding wires 1318 to have loops.

The third integrated circuit chip 1306 has second bonding wires 1324 to bond to a plating layer 1326 on a third row of leads 1328.

An optional paddle 1330 is positioned below the first integrated circuit chip 1302. The solder paste 1314 is reflow soldered to connect the first integrated circuit chip 1302 and the third row of leads 1316 and the entire structure is encapsulated in a molding compound 1332.

Figure 14:
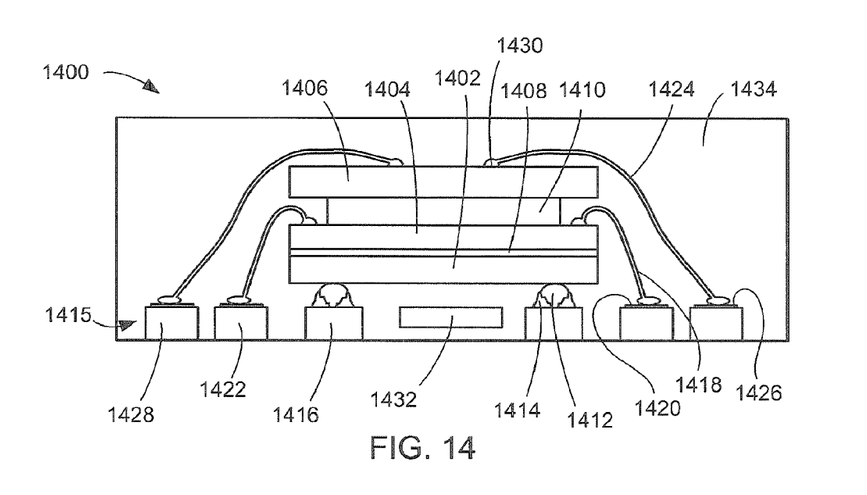
FIG. 14 shows a stacked three-die package with a dual-type leadframe in accordance with still another embodiment of the present invention.

Referring now to FIG. 14, therein is shown a stacked three-die package 1400 with a dual-type leadframe in accordance with a further embodiment of the present invention.

The package 1400 has a first integrated circuit chip 1402, a second integrated circuit chip 1404, and a third integrated circuit chip 1406. The first and second integrated circuit chips 1402 and 1404 are bonded to each other with die attach material 1408. The second integrated circuit chip 1404 is bonded to a Si spacer 1410, and third integrated circuit chip 1406 is bonded to the Si spacer 1410.

The first integrated circuit chip 1402 has solder bumps 1412 pressed into solder paste 1414 on a first row of leads 1416 of a leadframe 1415.

The second integrated circuit chip 1404 has first bonding wires 1418 bonded to a plating layer 1420 on the second row of leads 1422. The Si spacer 1410 is thick enough to allow clearance for the bonding wires 1418 to have loops while clearing the third integrated circuit chip 1404.

The third integrated circuit chip 1406 has second bonding wires 1424 to bond to plating layer 1426 on a third row of leads 1428. The second bonding wires 1424 are attached at the third integrated circuit chip 1406 to a number of center pads 1430.

An optional paddle 1432 is positioned below the first integrated circuit chip 1402. The solder paste 1414 is reflow soldered to connect the first integrated circuit chip 1402 and the entire structure is encapsulated in a molding compound 1434.

Figure 15:
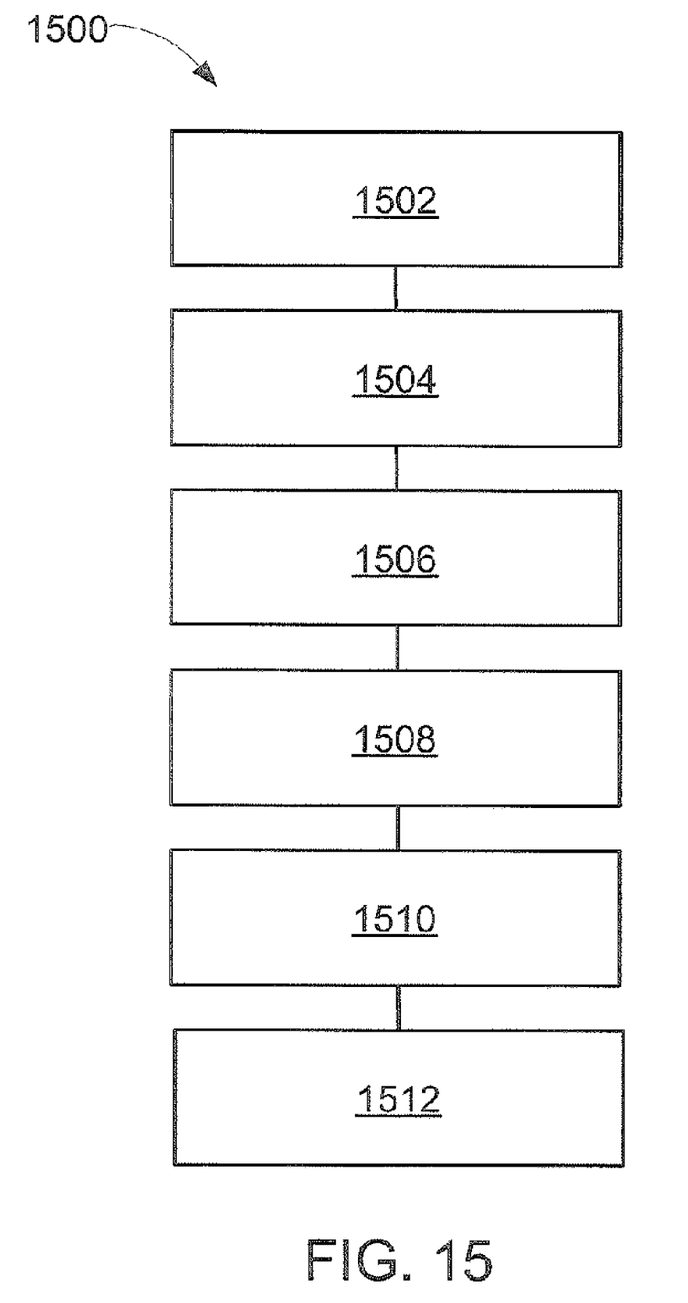
FIG. 15 shows an integrated circuit package system in accordance with a still further embodiment of the present invention.

Referring now to FIG. 15, therein is shown a flow chart of an integrated circuit package method 1500 for manufacturing the integrated circuit package system 100. The integrated circuit package method 1500 includes; forming a dual-type leadframe having first and second rows of leads in a block 1502; forming a first row of bumps on an integrated circuit chip in a block 1504; placing solder paste on the first row of leads in a block 1506; pressing the first row of bumps into the solder paste on the first row of leads in a block 1508; reflow soldering the solder paste to form solder and connect the integrated circuit chip to the first row of leads in a block 1510; and encapsulating the integrated circuit chip, the bumps, the solder, and the dual-type leadframe in a block 1512.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package method comprising:
   forming a dual-type leadframe having lead tips;
   forming a first row of bumps on an integrated circuit chip;
   placing solder paste on the lead tips;
   pressing the first row of bumps into the solder paste on the lead tips;
   reflow soldering the solder paste to form solder and connect the integrated circuit chip to the lead tips;
   encapsulating the integrated circuit chip, the bumps, the solder, and the dual-type leadframe; and
   planarizing the bottom of the dual-type leadframe after encapsulating to form a first row of leads.

2. The method as claimed in claim 1 further comprising:
   forming a second row of bumps on the integrated circuit chip;
   pressing the second row of bumps into the solder paste on the lead tips; and
   planarizing the bottom of the dual-type leadframe after encapsulating forms a second row of leads.

3. The method as claimed in claim 1 wherein:
   planarizing includes etching the bottom of the first row of leads after reflow soldering.

4. The method as claimed in claim 1 wherein:
   forming the dual-type leadframe includes a paddle.

5. The method as claimed in claim 1 further comprising:
   forming a plating layer on the lead tips;
   bonding a second integrated circuit chip to the first integrated circuit chip; and
   wire bonding the second integrated circuit chip to the plating layer on the lead tips.

6. The method as claimed in claim 5 wherein the wire bonding of the second integrated circuit chip includes wire bonding to center pads on at least one of the integrated circuit chips.

7. The method as claimed in claim 5 further comprising:
bonding a spacer to the second integrated circuit chip;
bonding a third integrated circuit chip to the spacer;
wire bonding the third integrated circuit chip to the lead tips; and
planarizing the bottom of the dual-type leadframe after encapsulating forms a third row of leads having the third integrated circuit chip wire bonded thereto.

8. An integrated circuit package method comprising:
forming a dual-type leadframe having lead tips in first and second rows with grooves or dimples;
forming a first row of bumps on an integrated circuit chip;
placing solder paste on the lead tips;
pressing the first row of bumps into the solder paste on the lead tips in the first row;
reflow soldering the solder paste to form solder and connect the integrated circuit chip to the lead tips in the first row;
encapsulating the integrated circuit chip, the bumps, the solder, and the leadframe to form an encapsulated structure;
planarizing the bottom of the dual-type leadframe after encapsulating to form a first row of leads and a second row of leads; and
singulating the encapsulated structure.

9. The method as claimed in claim 8 further comprising:
forming a second row of bumps on the integrated circuit chip;
depositing solder paste on the lead tips in the second row;
pressing the second row of bumps into the solder paste on the lead tips in the second row; and
reflow soldering the solder paste at one time.

10. The method as claimed in claim 8 further comprising:
etching the bottom half of the lead tips after reflow soldering.

11. The method as claimed in claim 8 further comprising:
singulating the dual-type leadframe to separate each of the lead tips in the first and second rows from each other and a paddle.

12. The method as claimed in claim 8 further comprising:
forming a plating layer on the lead tips in the second row;
bonding a second integrated circuit chip to the first integrated circuit chip; and
wire bonding the second integrated circuit chip to the plating layer on the lead tips in the second row.

13. The method as claimed in claim 12 wherein the wire bonding of the second integrated circuit chip includes wire bonding to center pads on at least one of the integrated circuit chips.

14. The method as claimed in claim 12 further comprising:
forming the leadframe with lead tips in a third row;
forming a plating layer on the lead tips in the third row;
bonding a spacer to the second integrated circuit chip;
bonding a third integrated circuit chip to the spacer; and
wire bonding the third integrated circuit chip to the lead tips in the third row.

\* \* \* \* \*